(12) United States Patent
Sakai et al.

(10) Patent No.: US 9,788,448 B2
(45) Date of Patent: Oct. 10, 2017

(54) BOARD CONNECTOR

(71) Applicant: Sumitomo Wiring Systems, Ltd., Yokkaichi, Mie (JP)

(72) Inventors: Masami Sakai, Mie (JP); Yoshiyuki Ishikawa, Mie (JP)

(73) Assignee: SUMITOMO WIRING SYSTEMS, LTD., Yokkaichi, Mie (JP)

( * ) Notice: Subject to any disclaimer, the term of this patent is extended or adjusted under 35 U.S.C. 154(b) by 0 days.

(21) Appl. No.: 15/291,197

(22) Filed: Oct. 12, 2016

(65) Prior Publication Data
US 2017/0127545 A1 May 4, 2017

(30) Foreign Application Priority Data

Oct. 30, 2015 (JP) ................. 2015-213737

(51) Int. Cl.
*H01R 13/73* (2006.01)
*H05K 7/14* (2006.01)
*H01R 12/70* (2011.01)
*H01R 13/46* (2006.01)

(52) U.S. Cl.
CPC ....... *H05K 7/1418* (2013.01); *H01R 12/7011* (2013.01); *H01R 13/46* (2013.01); *H01R 13/73* (2013.01); *H05K 7/1427* (2013.01)

(58) Field of Classification Search
CPC .. H05K 7/1418; H05K 7/1427; H01R 12/707; H01R 12/7011; H01R 12/7029; H01R 12/7035; H01R 12/7064; H01R 13/46
USPC ................ 439/660, 562, 566, 567, 874, 876
See application file for complete search history.

(56) References Cited

U.S. PATENT DOCUMENTS

| | | | | |
|---|---|---|---|---|
| 5,395,265 A * | 3/1995 | DiMondi | ............. | H01R 12/707 439/553 |
| 7,001,212 B1 * | 2/2006 | Juntwait | ................ | H05K 3/301 439/566 |
| 7,094,100 B2 * | 8/2006 | Nakano | ................ | H01R 12/707 439/566 |
| 7,347,725 B2 * | 3/2008 | Sakamoto | ............. | H05K 3/301 439/566 |
| 7,458,848 B2 * | 12/2008 | Nakano | ................. | H01R 13/41 439/570 |
| 7,488,208 B2 * | 2/2009 | Takahashi | .......... | H01R 12/7029 439/570 |

(Continued)

FOREIGN PATENT DOCUMENTS

JP 2006-324189 11/2006

*Primary Examiner* — Tulsidas C Patel
*Assistant Examiner* — Travis Chambers
(74) *Attorney, Agent, or Firm* — Gerald E. Hespos; Michael J. Porco; Matthew T. Hespos

(57) ABSTRACT

A housing (10) includes locking portions (13) on both sides of a mounting surface (12). A fixing member (60) includes a housing mounting portion (61) to be arranged along the mounting surface (12) in the housing (10) and locked by the locking portions (13). A plurality of ribs (18) arranged while being spaced apart in a first direction (front-back direction) along the mounting surface (12) and respectively extending in a second direction (vertical direction) intersecting with the first direction are provided on the mounting surface (12) of the housing (10). The housing mounting portion (61) of the fixing member (60) is provided with a plurality of grooves (69) extending in the second direction and to be fit to the respective ribs (18).

12 Claims, 7 Drawing Sheets

(56) References Cited

U.S. PATENT DOCUMENTS

| | | | | |
|---|---|---|---|---|
| 7,766,666 | B1 * | 8/2010 | Chen | H01R 13/20 439/65 |
| 8,821,187 | B2 * | 9/2014 | Aihara | H01R 12/707 439/566 |
| 2006/0264097 | A1 | 11/2006 | Nakano et al. | |

* cited by examiner

BOARD CONNECTOR

BACKGROUND

1. Field of the Invention

The invention relates to a board connector.

2. Description of the Related Art

Japanese Unexamined Patent Publication No. 2006-324189 discloses a board connector that includes a housing having a mounting groove and a fixing member to be inserted in the mounting groove and then fixed to a board. Retaining portions are provided on both side edges of the fixing member. The fixing member is inserted along a groove surface of the mounting groove so that the retaining portions of the fixing member bite into side edges of the groove surface to hold the fixing member in the housing. A locking projection is provided in a substantially central part of the groove surface of the mounting groove and a locking hole is provided at a position corresponding to the locking projection in a substantially central part of the fixing member. The locking projection of the housing is inserted and locked to the locking hole of the fixing member.

The connection of a mating housing to the housing may apply an external force to the fixing member in a rotating direction (see directions of arrows X of FIG. 1) along the groove surface of the mounting groove centered on a substantially central part of the fixing member and may cause the retaining portions to scrape the side edge parts of the mounting groove. More particularly, the fixing member of the above-described board connector may rotate about the locking projection inserted into the locking hole and the housing may be scraped.

The invention was completed based on the above situation and aims to provide a board connector capable of preventing a housing from being scraped when an external force acts on a fixing member.

SUMMARY

The invention is directed to a board connector with a housing and a fixing member. The housing has a mounting surface and locking portions are on both sides of the mounting surface. The fixing member includes a housing mounting portion and a board fixing portion. The housing mounting portion is to be arranged along the mounting surface in the housing and to be locked by the locking portions. The board fixing portion is to be fixed to a circuit board. Ribs are arranged along the mounting surface of the housing. The ribs are spaced apart in a first direction and extend in a second direction that intersects the first direction. The housing mounting portion of the fixing member is provided with grooves that extend in the second direction and that fit to the respective ribs. An external force may act on the fixing member in a direction intersecting the first and second directions (e.g. rotating direction centered on a substantially central part of the fixing member and extending along a groove surface of a mounting groove). However, the respective ribs and grooves are locked together to resist such an external force. Therefore, the fixing member will not scrape the sides of the mounting surface of the housing.

A slit for dividing the fixing member into a plurality of locking areas including the grooves may be provided between the grooves adjacent in the fixing member. Thus, a locking area where the ribs and the grooves are locked together can be divided by the slit so that locking forces in the respective locking areas do not influence each other.

The slit may extend in the second direction in the housing mounting portion, and extending lengths of the grooves and the ribs in the housing mounting portion may be longer than the slit. Thus, the ribs and grooves more strongly resist an external force in a direction intersecting the first and second directions. Further, the rigidity of the fixing member can be ensured by limiting the extending length of the slit in the housing mounting portion to a minimum necessary range.

DETAILED DESCRIPTION

Figure 1:
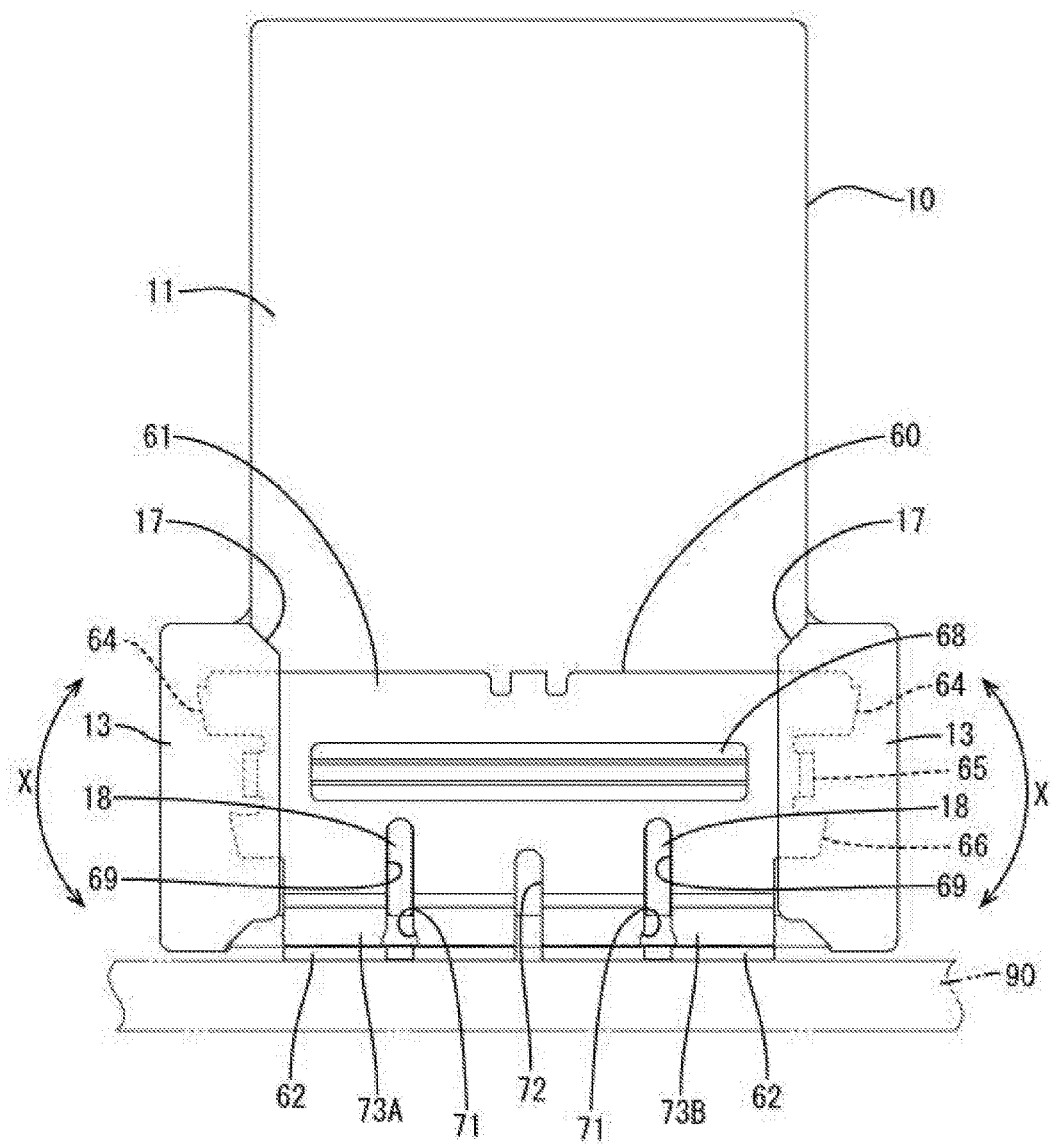
FIG. 1 is a side view of a board connector according to one embodiment of the invention.

An embodiment of the invention is described in detail with reference to FIGS. 1 to 7. A board connector according to this embodiment includes a housing 10 made of synthetic resin and fixing members 60 made of metal and to be mounted into the housing 10, and is fixed by being mounted on a printed circuit board (hereinafter, referred to as a board 90) via the fixing members 60. Note that, in the following description, a front-back direction is a lateral direction in FIG. 1 and a vertical direction is based on FIG. 1.

The housing 10 includes a tubular receptacle 11 extending along a standing direction (vertical direction) from a surface of the board 90. The receptacle 11 is open upward and an unillustrated mating housing is fitted thereinto from above. Unillustrated terminal fittings to be connected to conductive portions of the board 90 are arranged to project in the vertical direction in the receptacle 11.

Figure 2:
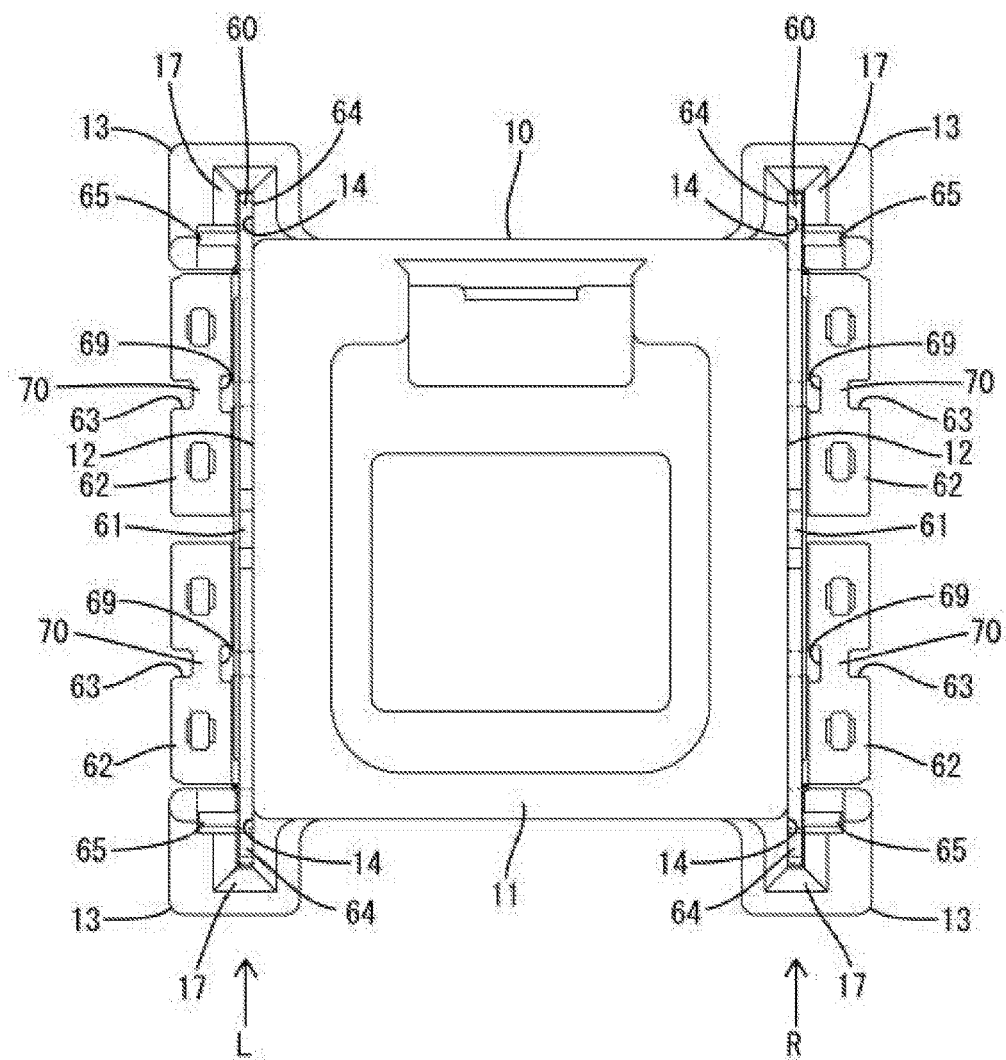
FIG. 2 is a plan view of the board connector.
Figure 5:
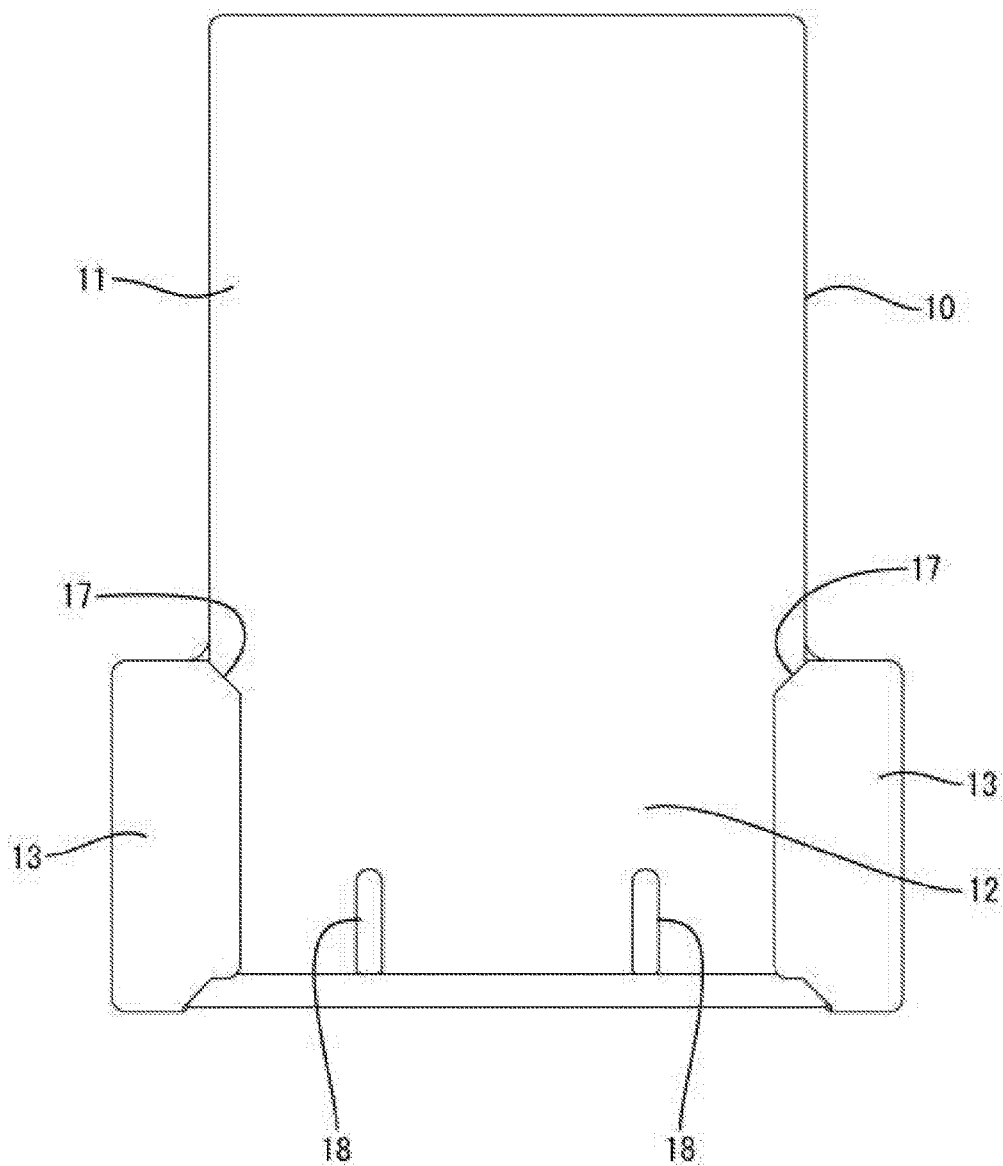
FIG. 5 is a side view of a housing.

As shown in FIGS. 2 and 5, a pair of mounting areas L, R for mounting the fixing members 60 are provided on lower end parts of both left and right surfaces of the receptacle 11. The mounting area L, R is configured by mounting surface 12 extending along the vertical direction and locking portions 13 paired on both front and rear sides across the mounting surface 12. The mounting surfaces 12 are flat surfaces connected to upper parts of the both left and right surfaces of the receptacle 11 without any step.

Figure 3:
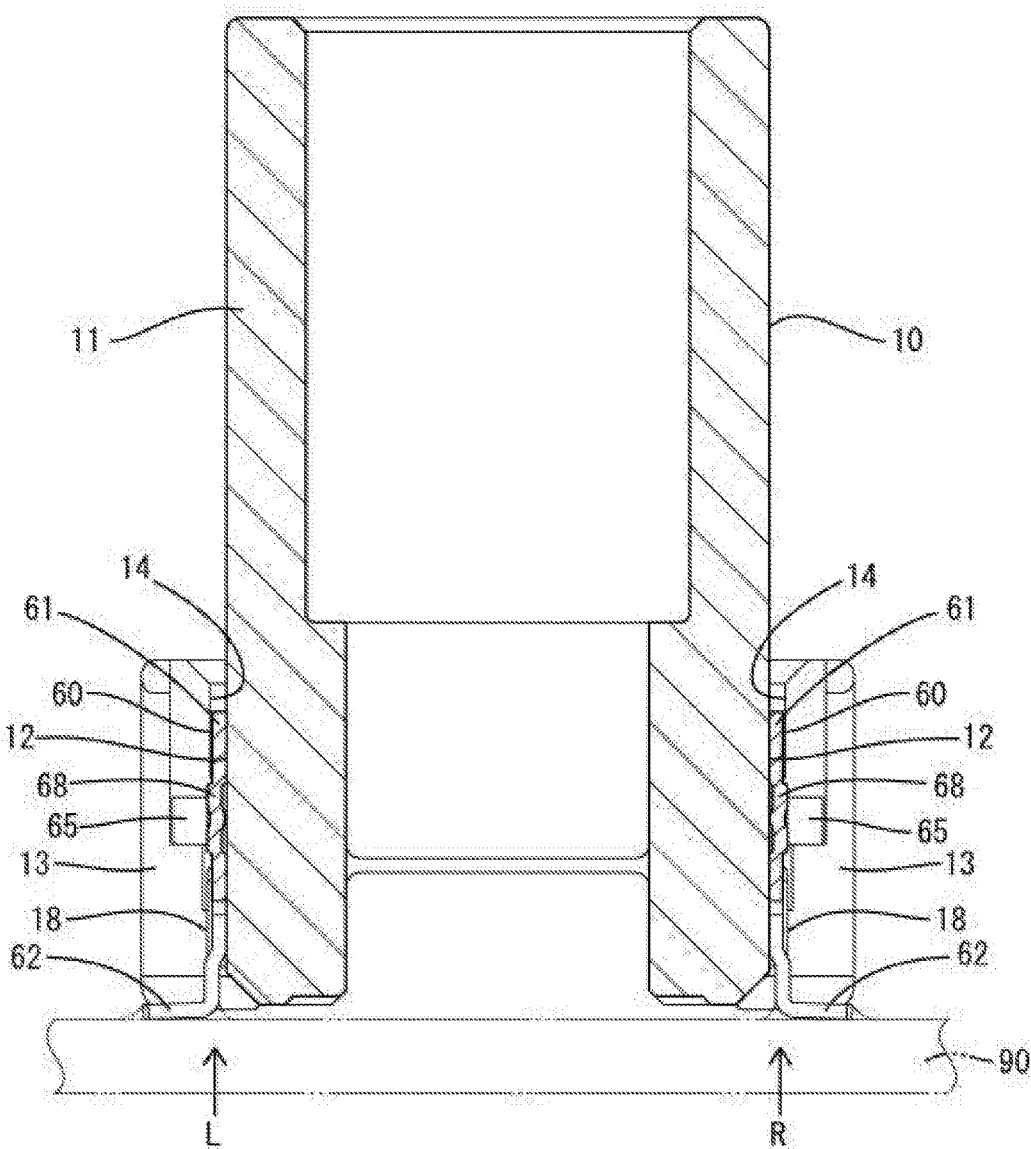
FIG. 3 is a front view in section of the board connector.
Figure 4:
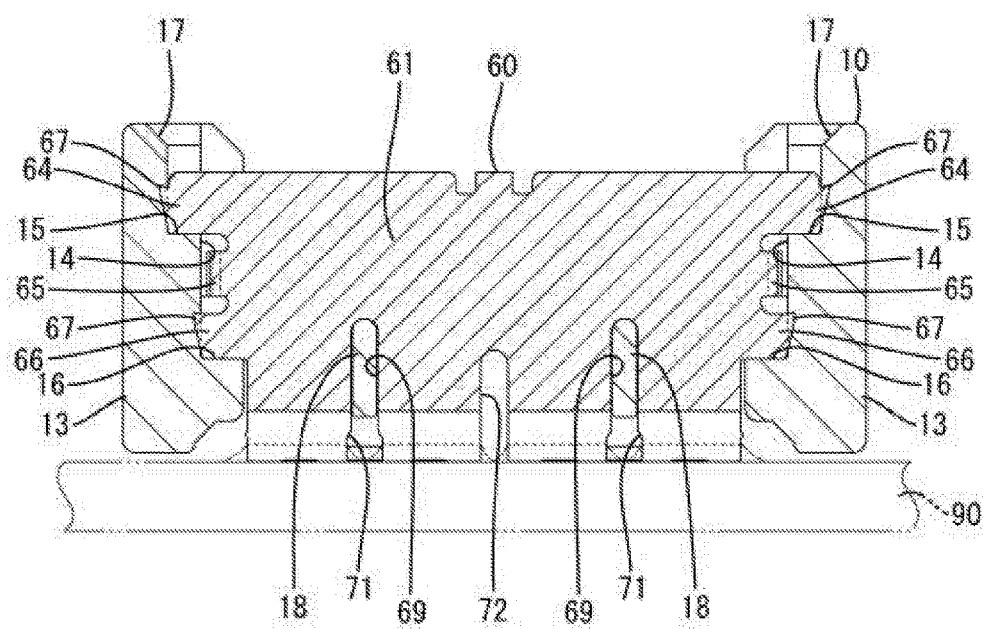
FIG. 4 is a section showing a state where a fixing member is locked by locking portions.

The locking portions 13 are in the form of columns protruding toward both front and rear sides from a lower end part of the receptacle 11, laterally projecting to cover both front and rear edges of the mounting surfaces 12 and extending in the vertical direction. As shown in FIGS. 2 to 4, the locking portion 13 is provided with a slit-like mounting groove 14 extending in the vertical direction and open upward and on the side of the mounting surface 12. As shown in FIG. 4, the mounting groove 14 includes a plurality of step portions 15, 16 at vertical intermediate positions and is formed to be gradually narrowed toward a lower side via the respective step portions 15, 16. Specifically, the plurality of step portions 15, 16 are composed of the step portions 15, 16 in upper and lower stages and respectively arranged to extend in the front-back direction. Further, a guiding portion 17 widened toward an upper side is provided on the opening edge of the mounting groove 14.

As shown in FIG. 5, the mounting surface 12 of the receptacle 11 is provided with a plurality of ribs 18. A pair of the ribs 18 are arranged in parallel to each other while being spaced apart in the front-back direction (first direction) along the mounting surface 12 in a lower part of the mounting surface 12. Further, the ribs 18 are elongated projections extending long and narrow in the vertical direction (second direction) intersecting with, specifically perpendicular to the front-back direction along the mounting surface 12, upper end parts thereof are rounded into a semicircular shape when viewed laterally and parts thereof other than the upper end parts extend in the vertical direction while having a substantially constant width. The lower ends of the ribs 18 are located at the same height as the lower end of the receptacle 11 and the upper ends of the ribs 18 are located below half the height of the mounting surface 12. Note that the lower ends of the locking portions 13 are located below the lower end of the receptacle 11.

Next, the fixing members 60 are described. The fixing members 60 are plate members made of metal and, as shown in FIGS. 2 and 3, a pair of the fixing members 60 are mounted in the mounting areas L, R provided on the both left and right surfaces of the receptacle 11. Specifically, as shown in FIGS. 6 and 7, the fixing member 60 includes a housing mounting portion 61 in the form of a flat plate extending along the vertical and front-back directions and board fixing portions 62 in the form of flat plates connected to the lower end of the housing mounting portion 61 and projecting short in a direction away from the mounting area L, R and extending along the front-back and lateral directions.

Figure 6:
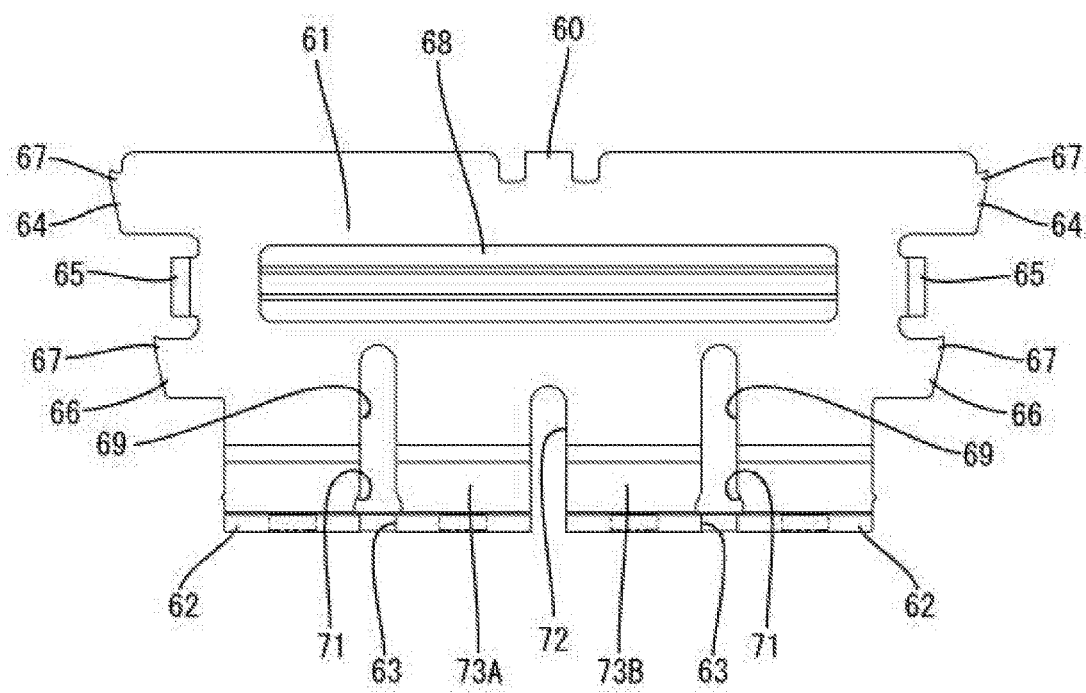
FIG. 6 is a side view of the fixing member.
Figure 7:
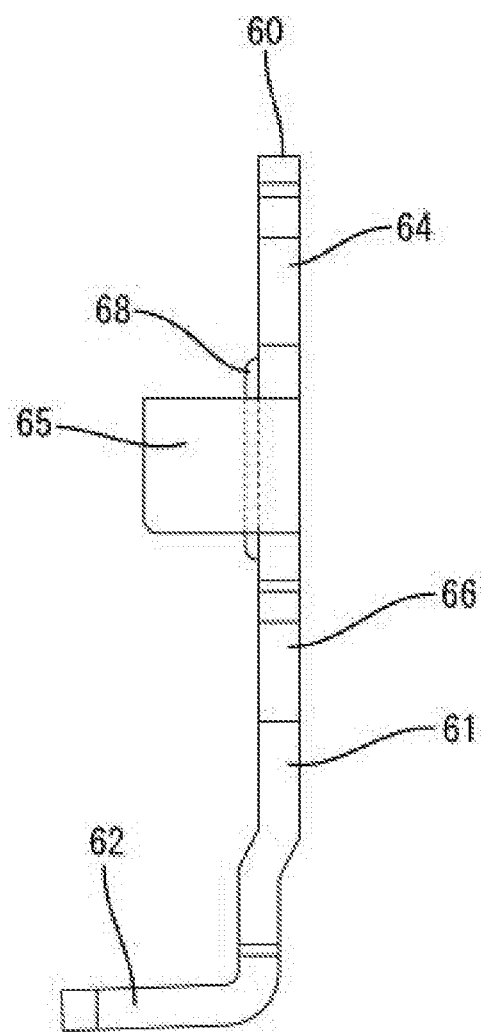
FIG. 7 is a front view of the fixing member.

As shown in FIGS. 2 and 6, a pair of front and rear board fixing portions 62 are arranged via a slit 72 to be described later. When the fixing member 60 is mounted into the mounting area L, R, the lower surfaces of the board fixing portions 62 are placed on the surface of the board 90 and fixed by soldering. A cut portion 62 in the form of a rectangular recess is provided to be open in a substantially central part of the projecting end of the board fixing portion 62 in the front-back direction.

The housing mounting portion 61 is formed to be long in the front-back direction and short in the vertical direction and, as shown in FIGS. 2 and 3, arranged along the mounting surface 12. As shown in FIG. 6, a plurality of lock receiving portions 64, 65 and 66 are provided side by side in the vertical direction on both front and rear edges of the housing mounting portion 61. Out of the lock receiving portions 64, 65 and 66, the lock receiving portions 64 in an upper stage are in the form of projecting pieces whose upper ends are connected to the upper end of the housing mounting portion 61 without any step and largely projecting forward and backward, and the lock receiving portions 66 in a lower stage are in the form of projecting pieces projecting shorter than the lock receiving portions 64 in the upper stage from vertical intermediate positions of the housing mounting portion 61.

The respective lock receiving portions 64, 66 in the upper and lower stages have plate surfaces continuous and flush with the plate surfaces of the housing mounting portion 61. Further, each of the respective lock receiving portions 64, 66 in the upper and lower stages includes a tapered biting projection 67 gradually widened outwardly toward an upper side on the projecting end edge. The upper end of the biting projection 67 is formed to be pointed upwardly and have an edge-like shape.

When the fixing member 60 is mounted into the mounting area L, R, the housing mounting portion 61 faces the mounting surface 12 and, as shown in FIG. 4, the lock receiving portions 64 in the upper stage are supported in contact with the step portions 15 in the upper stage and the lock receiving portions 66 in the lower stage are supported in contact with the step portions 16 in the lower stage. At this time, each biting projection 67 bites into the groove edge of the mounting groove 14, whereby the fixing member 60 is positioned and held in the housing 10.

Further, as shown in FIGS. 6 and 7, the lock receiving portions 65 in a middle stage located between the lock receiving portions 64 and 66 in the upper and lower stages in the vertical direction out of the respective lock receiving portions 64, 65 and 66 are in the form of projecting pieces bent at the both front and rear edges of the housing mounting portion 61 and projecting laterally outwardly (toward a front side of the plane of FIG. 6). The lock receiving portion 65 in the middle stage has plate surfaces intersecting with (specifically perpendicular to) those of the housing mounting portion 61. As shown in FIGS. 3 and 4, the fixing member 60 is positioned in the vertical direction by the lock receiving portions 65 in the middle stages being locked to the groove edges of the mounting grooves 14.

The housing mounting portion 61 is provided with a reinforcing portion 68 bulging toward a side opposite to the one facing the mounting surface 12 and extending in the front-back direction. Predetermined rigidity can be ensured for the housing mounting portion 61 by the reinforcing portion 68.

Further, as shown in FIG. 6, the housing mounting portion 61 is provided with a plurality of grooves 69 extending long and narrow in the vertical direction (second direction) and open on the lower end. As shown in FIG. 2, the lower end of each groove 69 is open on a base end part of the board fixing portion 62 and arranged at a position facing the cut portion 63 via a constricted area 70. Further, as shown in FIG. 6, a lower end part of each groove 69 is provided with inclined guide edges 71 widened toward the board fixing portion 62 (lower side).

The respective grooves 69 are arranged at a plurality of positions spaced apart in the front-back direction (first direction), specifically a pair of the grooves 69 are arranged in parallel to each other at two positions in a lower part of the housing mounting portion 61. Each groove 69 is formed at a position corresponding to the rib 18 so that the rib 18 is fittable thereinto. Specifically, the groove 69 has a semicircularly rounded upper end edge when viewed laterally, and edge parts except the upper end edge and the guide edges 71 extend in the vertical direction while defining a substantially constant width. The upper end of the groove 69 is arranged at a position overlapping the lock receiving portions 66 in the lower stage in the vertical direction near the reinforcing portion 68.

Further, as shown in FIG. 6, a substantially central part of the lower part of the housing mounting portion 61 in the front-back direction between the respective grooves 69 is cut to provide the slit 72. The slit 72 is arranged on the housing mounting portion 61 and the board fixing portions 62 and formed to extend in the vertical direction in the housing mounting portion 61 and extend in the lateral direction in the board fixing portions 62 and be open on the projecting ends of the board fixing portions 62. A vertical extending length of the slit 72 in the housing mounting portion 61 is shorter than that of the grooves 69 and the upper end of the slit 72 is located below those of the grooves 69. The slit 72 in the housing mounting portion 61 has substantially the same shape as the grooves 69 except such a difference in the extending length. Note that the fixing member 60 is divided into a pair of front and rear locking areas 73A, 73B via the slit 72 and the grooves 69 are arranged in substantially central parts of the respective locking areas 73A, 73B in the front-back direction.

Next, functions and effects of the board connector of this embodiment are described.

In assembling, the housing mounting portions 61 of the fixing members 60 are slid and inserted along the mounting surfaces 12 of the receptacle 11 into the mounting areas L, R from above. Then, the respective lock receiving portions 64, 66 in the upper and lower stages are guided by the guiding portions 17 to enter the mounting grooves 14 and come into contact with the step portions 15 in the upper and lower stages, and the respective biting projections 67 bite into the groove edges of the mounting grooves 14 to be locked (see FIG. 4).

In the process of mounting the fixing member 60, the corresponding grooves 69 of the housing mounting portion 61 are fitted to the respective ribs 18 provided on the mounting surface 12 of the receptacle 11 from above. At this time, the upper end parts of the ribs 18 are guided by the guide edges 71 of the grooves 69, whereby the ribs 18 are smoothly inserted into the grooves 69. When the fixing member 60 is properly mounted, the ribs 18 are fitted and inserted into the grooves 69, leaving almost no clearances in the upper parts of the grooves 69 (parts excluding lower end parts (guide edges 71)) (see FIG. 4). Thereafter, the board connector is mounted on the board 90 by fixing the board fixing portions 62 of the fixing members 60 to the board 90 by reflow soldering and connecting the unillustrated terminal fittings to the conductive portions of the board 90 by soldering. After the fixing members 60 are fixed to the board 90, the housing 10 is connected to the unillustrated mating housing.

If the housing 10 is repeatedly connected to the mating housing or the mating housing is forcibly connected to the housing 10, an external force may be applied in a direction to remove the fixing members 60 from the mounting areas L, R and, further, an external force in a rotating direction (see directions of arrows X of FIG. 1) centered on substantially central parts of the housing mounting portions 61 may be applied. If the fixing members 60 are removed from the mounting areas L, R according to an external force in such a rotating direction or the like, the biting projections 67 may scrape the groove edges of the mounting grooves 14 and the respective lock receiving portions 64, 65 and 66 may not be properly locked by the locking portions 13 and the housing mounting portions 61 of the fixing members 60 may shake in the mounting areas L, R when the fixing members 60 are mounted thereafter.

However, in the case of this embodiment, the respective ribs 18 and the respective grooves 69 extend in the vertical direction (second direction) intersecting with the rotating direction of the housing mounting portions 61 and a plurality of those are arranged while being spaced apart in the front-back direction (first direction) intersecting with the rotating direction and are locked to each other to resist the rotation of the housing mounting portions 61. Thus, the rotation of the fixing members 60 in the rotating direction can be suppressed. As a result, the inclination of the fixing members 60 in the rotating direction is restricted and a situation where the groove edges of the mounting grooves 14 are scraped can be prevented.

Further, since the fixing member 60 is divided into the pair of front and rear locking areas 73A, 73B via the slit 72, even if one locking area 73A is deformed by the locking of the ribs 18 and the grooves 69 when an external force in the rotating direction acts, the influence of that deformation on the adjacent other locking area 73B can be prevented. As a result, the fixing member 60 is more stably held in the housing 10. In addition, since the vertical extending length of the grooves 69 is longer than that of the ribs 18 in the housing mounting portion 61, the locking of the ribs 18 and the grooves 69 can more strongly resist the external force in the rotating direction. By limiting the formation area of the slit 72 to a minimum necessary range, predetermined rigidity can be ensured for the fixing member 60.

Other embodiments are briefly described below.

The receptacle of the housing may be open in a horizontal direction parallel to a surface direction of the board.

Three or more ribs may be provided on the mounting surface of the housing and three or more grooves may be provided on the housing mounting portion of the fixing member.

Similarly to the slit, the grooves may extend in the lateral direction in the board fixing portions and be open on the projecting ends.

The fixing member may be provided with a plurality of slits and three or more locking areas may be provided via each slit.

The first and second directions have only to be directions intersecting with each other and the rotating direction. Thus, contrary to the above embodiment, the first direction may be the vertical direction and the second direction may be the front-back direction. Further, the first and second directions may be directions oblique to the vertical direction and the front-back direction.

LIST OF REFERENCE SIGNS

10 . . . housing
12 . . . mounting surface
13 . . . locking portion
18 . . . rib
60 . . . fixing member
61 . . . housing mounting portion
62 . . . board fixing portion
69 . . . groove
72 . . . slit
73A, 73B . . . locking area
90 . . . board (printed circuit board)

What is claimed is:

1. A board connector, comprising:
a housing with a bottom to be mounted in opposed relation to a circuit board, a mounting surface aligned at an angle to the bottom and two opposed locking portions projecting from the mounting surface at positions spaced apart in a first direction; and
a fixing member including a housing mounting portion to be arranged along the mounting surface of the housing, the housing mounting portion having opposite ends that are spaced apart in the first direction, the opposite ends of the housing mounting portion being configured to be locked by the locking portions and a board fixing portion extending from a bottom end of the housing mounting portion and configured to be fixed to the circuit board wherein:
ribs are arranged along the mounting surface of the housing at positions spaced from the locking portions in the first direction, the ribs being spaced apart from one another in the first direction and respectively extending in a second direction intersecting the first direction;
the housing mounting portion of the fixing member is provided with a plurality of grooves extending in the second direction from the bottom end of the housing mounting portion, the grooves being disposed and dimensioned to be fit to the respective ribs; and the board fixing portion connects areas of the housing mounting portion on opposite sides of each of the grooves to prevent widening of the grooves.

2. The board connector of claim 1, further comprising a slit between the grooves in housing mounting portion of the fixing member and extending completely across the board fixing portion of the fixing member for dividing the fixing member into locking areas, with each of the locking areas including one of the grooves.

3. The board connector of claim 2, wherein the slit extends in the second direction and has a length in the second direction, and extending lengths of the grooves in the second direction are longer than the slit.

4. The board connector of claim 1, wherein the grooves in the housing mounting portion of the fixing member are spaced from the opposite ends of the housing mounting portion.

5. The board connector of claim 1, wherein the grooves are open at the bottom end of the housing mounting portion.

6. The board connector of claim 1 wherein the board fixing portion of the fixing member extends substantially perpendicularly from the bottom end of the housing mounting portion of the fixing member.

7. The board connector of claim 1, wherein each of the locking portions of the housing is formed with a first and second steps spaced from one another in the second direction, and wherein each of the opposite ends of the housing mounting portion of the fixing member includes a first lock receiving portion and a second lock receiving portion between the first lock receiving portion and the bottom end of the housing mounting portion, the first lock receiving portions projecting farther in the first direction than the second lock receiving portions, the first and second lock receiving portions of the housing mounting portion of the fixing member being disposed and dimensioned to engage the respective first and second steps in the respective locking portion of the housing as the fixing member is moved down along the mounting surface of the housing.

8. A board connector, comprising:

a housing with a bottom surface to be mounted in opposed relation to a circuit board, a mounting surface aligned at an angle to the bottom surface, two opposed locking portions projecting from each of the mounting surfaces at positions on the respective mounting surfaces spaced apart in a first direction, each of the mounting surfaces having a plurality of ribs spaced apart from one another in the first direction and extending respectively in a second direction perpendicular to the first direction; and a fixing member with a housing mounting portion arranged along the mounting surface of the housing, the housing mounting portion having opposite ends that are spaced apart in the first direction and that are locked with the locking portions projecting from the mounting surface, the housing mounting portion further having grooves extending in the second direction from a bottom end of the housing mounting portion and being fit respectively to the ribs on the mounting surface of the housing, the fixing member further having a board fixing portion extending substantially perpendicularly from a bottom end of the housing mounting portion and configured to be fixed to the circuit board, the board fixing portion being connected to areas of the housing mounting portion on opposite respective sides of each of the grooves and extending continuously across the respective grooves.

9. The board connector of claim 8, further comprising a slit between the grooves in the fixing member for dividing the fixing member into locking areas, with each of the locking areas including one of the grooves.

10. The board connector of claim 9, wherein the slit extends in the second direction and has a length in the second direction, and extending lengths of the grooves in the second direction are longer than the slit.

11. The board connector of claim 8, wherein the grooves provided in the housing mounting portion of the fixing member are spaced from the opposite ends of the housing mounting portion of the fixing member.

12. The board connector of claim 8, wherein the grooves are open at the bottom end of the housing mounting portion.

* * * * *